United States Patent [19]

Laporte et al.

[11] Patent Number: 4,491,496
[45] Date of Patent: Jan. 1, 1985

[54] ENCLOSURE FOR THE TREATMENT, AND PARTICULARLY FOR THE ETCHING OF SUBSTRATES BY THE REACTIVE PLASMA METHOD

[75] Inventors: Philippe Laporte, Echirolles; Louise Peccoud, Claix, both of France

[73] Assignee: Commissariat a l'Energie Atomique, Paris, France

[21] Appl. No.: 568,099

[22] Filed: Jan. 4, 1984

[30] Foreign Application Priority Data

Jan. 5, 1983 [FR] France ............................ 83 00073

[51] Int. Cl.$^3$ .................. H01L 21/30; B44C 1/22; C03C 15/00; C23F 1/00
[52] U.S. Cl. .................................. 156/345; 156/643; 156/646; 204/298; 204/192 E
[58] Field of Search ............ 156/643, 646, 345; 204/164, 192 E, 192 EC, 298; 427/39; 118/728, 732, 50, 50.1, 620

[56] References Cited

U.S. PATENT DOCUMENTS

| | | | |
|---|---|---|---|
| 4,325,778 | 4/1982 | Lepselter | 156/643 |
| 4,384,918 | 5/1983 | Abe | 156/643 |
| 4,424,096 | 1/1984 | Kumagai | 156/643 |

Primary Examiner—William A. Powell

[57] ABSTRACT

Enclosure for the treatment of substrates by the reactive plasma method, consisting in a known manner of an inlet and an outlet (12) for the circulation of a reactive gas at low pressure, a base supporting the substrate (10) to be treated being placed between two electrodes, one of which (3) is at the ground potential and the other (4) or radio-frequency electrode is brought to an alternative potential such as to create an electrical discharge in the enclosure. It is characterized in that the enclosure is metallic and lined by plasma torch spraying with a protective coating (2) of alumina ($Al_2O_3$) of a thickness of about 300 micrometers.

5 Claims, 1 Drawing Figure

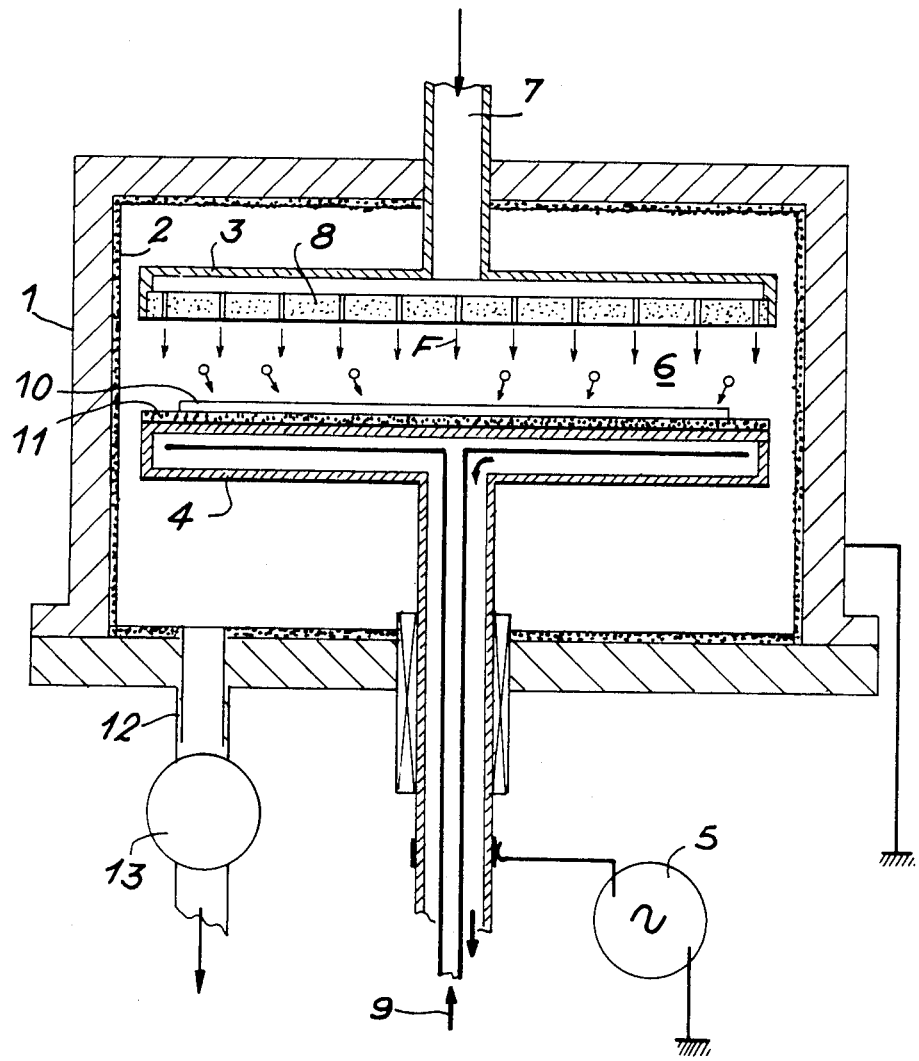

ENCLOSURE FOR THE TREATMENT, AND PARTICULARLY FOR THE ETCHING OF SUBSTRATES BY THE REACTIVE PLASMA METHOD

The object of the present invention is an enclosure designed for the treatment, and particularly for the etching of substrates by a reactive plasma.

The invention finds application in the depositing of layers of any nature (insulating, conductive, semiconductive) on any substrates (metal, semiconductors, insulating materials), as for example in the depositing of insulating material on silicon substrates, a fundamental operation in the manufacture of semiconductors.

In particular, it finds an outstanding application in the etching of a substrate if the gas introduced is appropriate for this purpose.

It is known that the process of depositing coatings by a luminous discharge is particularly desirable when it is desired to protect the substrate against a great elevation of temperature. It is known that the ordinary vapor-phase chemical depositing methods require a high temperature, for example of at least 350° C. for silica and 600° C. for silicon nitride. These methods are therefore inapplicable to certain substrates, such as HgCdTe or AsGa or ZnTe, for example, which cannot withstand such temperatures. The luminous discharge depositing technique, which makes it possible to produce deposits at a temperature close to ambient, therefore offers a real advantage.

The luminous discharge reactive depositing process consists essentially in producing a plasma in a reactive mixture introduced into an enclosure where the substrates to be coated are arranged. One of the effects of the plasma is to break certain molecular bonds of the gases present and to initiate chemical reactions. The substrates distributed about the base placed in the vicinity of the plasma then become covered with a coating whose composition depends on the mixture of gases used.

Information regarding this technique can be found, for example, in U.S. Pat. No. 3,757,733 of Alan R. Reinbert issued on Sept. 11, 1973 and entitled "Radial Flow Reactor," or in the article entitled, "A Production Reactor for Low Temperature Plasma-Enhanced Silicon Nitride Deposition," published by R. S. Rosler et al. in the periodical, "Solid State Technology," Vol. 19, No. 6, 1976, page 45, and in the articles cited therein.

Such improved enclosures for treating substrates by the reactive plasma method have also been described previously in CEA Patent No. 7,720,766 of July 6, 1977, essentially involving means for making more uniform the distribution of the reactive gas which, after having passed the introduction electrode, reaches the substrate being treated.

The etching of a substrate under a reactive plasma is gaining increasing importance in integrated circuit technology for the manufacture of films containing silicon, silicon compounds (silica, silicide, silicon nitride) as well as aluminum and its compounds (aluminum-silicon, aluminum-silicon-copper). Other semiconductive compounds such as gallium arsenide, indium antimonide and indium phosphide, also are created by this known technique.

The reactive plasma etching process consists in introducing a reactive gas at low pressure into the etching enclosure containing the substrate to be etched, and in subjecting this gas to a cold electrical discharge (temperature close to the ambient temperature) which dissociates the gas to active diffusing particles, that is to say, ions and free radicals, which will then react with the substrate and eventually etch it. It has unfortunately been found that the physical and chemical nature of the material constituting the enclosure itself plays a very important part in the kinetics and performance of the etching or depositing being practiced.

The fact is that the plasma is not absolutely confined between the two electrodes, but due to the pressure conditions and the nature of the reactive gas, it can diffuse all the way to the walls of the reactor. The dissociation and/or the recombination of the active diffusing particles on the walls of the enclosure is variable according to the chemical reactivity of these walls, and large formations of polymers have been observed when the walls of the enclosure are made of stainless steel; in this latter case, a different reaction mechanism is brought about, involving a notable reduction of the etching rate, a loss of selectivity of the etching of one material with respect to another, and a modification of the profiles of these same etchings; even the chemical nature of the walls changes the plasma potential and changes the ion/neutron ratio.

To combat these difficulties, it has been attempted to use walls which are more inert by nature, such as the quartz that has been used with success to retard the formation of the above-mentioned polymers in the reactive plasma etching enclosures. Unfortunately, the use of quartz in the construction of these walls involves a very high installed cost, an increased mechanical fragility since quartz is more fragile than metals, and lastly the risk of the introduction of a partial pressure of oxygen in the enclosure while it is in operation. Indeed, the active radicals which migrate toward the walls attack quartz and, in some cases, can release oxygen into the enclosure, which does considerable harm to the kinetics of the etching reactions as well as to the quality of the etching or of the deposits obtained.

The object of the present invention is precisely an enclosure for the treatment of substrates by the reactive plasma method, which, by particularly simple means, remedies the difficulties of the prior art referred to above.

This enclosure for the treatment of substrates by the reactive plasma method of the kind which include, in a known manner, an inlet and an outlet for the circulation of a reactive gas at low pressure, a base supporting the substrates to be treated being placed between two electrodes, one of which is at the ground potential and the other, or radiofrequency electrode, is brought to an alternating potential such as to create in the enclosure an electrical discharge which dissociates the gas into reactive particles which are deposited on the substrate, is characterized in that the enclosure is metallic and is lined by plasma-torch spraying with a protective layer of alumina $Al_2O_3$ of a thickness between 300 micrometers and 500 micrometers.

In accordance with the invention, the reactor enclosure is made of a metal or alloy such as, for example, aluminum or stainless steel, and coated by the Schoop process or plasma-torch spraying with a protective lining over its entire inside surface. The lining material is used in the form of a powder of selected granulometry, which is projected in the plasma torch such that the material used is melted in the flame and is projected in the molten state onto the inside surface of the reactor enclosure, where it then forms an adherent deposit. Preferentially, the protective layer of material thus deposited is a layer of alumina $Al_2O_3$ whose thickness is between 300 and 500 micrometers. In a preferred embodiment of the invention, the alumina coating is completed by an impregnation with silicone produced under pressure and at [elevated] temperature.

According to a secondary but important feature of the present invention, the radiofrequency electrode of the enclosure is also covered with a protective material, which can be, in certain cases, alumina $Al_2O_3$ but preferably tungsten, particularly when the etching reaction takes place in an environment of trifluoromethane $CHF_3$.

One original application of the present invention is to improve the etching anisotropy of polycrystalline silicon during etching with $SF_6$. Indeed, a stainless steel reactor lined with a deposit of $Al_2O_3$ applied by the Schoop process produces an anisotropic etching of silicon by $SF_6$, whereas in the same conditions an unlined reactor gives an isotropic etching of silicon.

In any case, the invention will be better understood by reading the following description of an embodiment given by way of non-restrictive example, which will be described with reference to the single drawing appended, showing in cross sectional elevation an enclosure in accordance with the present invention.

In the single drawing, the enclosure 1 for the etching of the substrate is shown, which is made of stainless steel or aluminum, and lined by the Schoop process with a coating 2 of alumina $Al_2O_3$ of a thickness of about 300 micrometers. This enclosure includes, in a known manner, two electrodes, an upper one 3 of which is at ground potential and the other, lower one 4 is brought to an alternating potential by an alternator 5 so as to create at 6, in the space between the electrodes 3 and 4, an electrical discharge or plasma. The upper electrode 3, which is fixed and hollow, is connected to a duct 7 for the introduction of the reactive gas at low pressure, which is distributed in the space between the electrodes 3 and 4 through a porous wall 8 which renders uniform the flow of gas in this zone, as represented by the various arrows F.

A duct 12 equipped with a pump 13 maintains the circulation and exhaustion from the enclosure 1 of the reactive gas introduced through the duct 7.

The lower, radiofrequency electrode 4 is movable about its axis and includes a cooling fluid circuit 9. In the example described, it serves as a base supporting the substrate 10 being etched, which is thus directly exposed to the flow of reactive gas emerging from the porous wall 8. The plasma produced in the space 6 dissociates the reactive gas into active diffusing particles, that is, into ions and free radicals, which react directly on the substrate 10 that is to be etched.

In the particular example described, the radiofrequency electrode 4 is also protected by a coating 11 produced by the Schoop process to improve the qualities of the etching and prevent powdering.

The enclosure described in the above figure has been used with an alumina coating on a stainless steel reactor to produce etchings of a silica substrate in a trifluoromethane environment in a quite satisfactory manner, whereas under identical conditions, but the absence of the alumina coating, the polymerization reactions which developed on the interior surface of the enclosure completely destroyed the desired etching phase.

Parallel to the technical advance contributed by this coating 2 of the internal wall, the covering of the radiofrequency electrode with a material such as tungsten, which remains inert in the presence of ionic bombardment in a trifluoromethane environment, has made it possible to improve the selectivity of silica-silicon etchings by a factor of 2 in comparison with a radiofrequency electrode simply coated with alumina. In this regard it will be recalled that the selectivity of the etching of one substance with respect to another is defined by the ratio of the etching rates of each of these substances.

Lastly, it is to be noted that the alumina coating 2 has interesting properties, particularly because it is easy to clean and is free of any porosity.

Of course, the specification of alumina and tungsten for coatings of the enclosure and of the radiofrequency electrode is not intended as any limitation; any other appropriate material or alloy can also be used as desired, depending on the purposes pursued, without thereby departing from the scope of the invention.

We claim:

1. Enclosure for the treatment and particularly the etching of substrates by the reactive plasma method, of the kind including, in a known manner, an inlet (7) and an outlet (12) for the circulation of a reactive gas at low pressure, a base supporting the substrate (10) to be treated placed between two electrodes of which one (3) is at ground potential, and the other (4) or radiofrequency electrode is brought to an alternating potential such as to create in the enclosure an electrical discharge which dissociates the gas into reactive particles which react on the substrate, characterized in that the enclosure is metallic and covered on the inside by plasma-torch spraying with a protective coating (2) of alumina ($Al_2O_3$) of a thickness between 300 micrometers and 500 micrometers.

2. Enclosure of claim 1, characterized in that the alumina ($Al_2O_3$) coating of the enclosure is completed by a silicone impregnation.

3. Enclosure of claim 1, characterized in that the radiofrequency electrode (4) is also covered with a protective material.

4. Enclosure of claim 3, characterized in that the protective material covering the radiofrequency electrode is alumina ($Al_2O_3$).

5. Enclosure of claim 3, characterized in that the protective material covering the radiofrequency electrode is tungsten.

* * * * *